United States Patent
Ramamurthy

(10) Patent No.: US 9,652,266 B2
(45) Date of Patent: *May 16, 2017

(54) AUTOMATED SYSTEM AND METHOD FOR KNOWLEDGE TRANSFER, END USER SUPPORT AND PERFORMANCE TRACKING DURING A LIFE CYCLE OF ENTERPRISE APPLICATIONS

(71) Applicant: EPIANCE SOFTWARE PVT. LTD., Bangalore (IN)

(72) Inventor: Ravi Ramamurthy, Bangalore (IN)

(73) Assignee: EPIANCE SOFTWARE PVT. LTD., Bangalore, Karnataka (IN)

( * ) Notice: Subject to any disclaimer, the term of this patent is extended or adjusted under 35 U.S.C. 154(b) by 792 days.

This patent is subject to a terminal disclaimer.

(21) Appl. No.: 13/962,039

(22) Filed: Aug. 8, 2013

(65) Prior Publication Data

US 2014/0046648 A1  Feb. 13, 2014

(30) Foreign Application Priority Data

Aug. 8, 2012 (IN) .......................... 3268/CHE/2012

(51) Int. Cl.
| | |
|---|---|
| G06F 9/45 | (2006.01) |
| G06F 9/455 | (2006.01) |
| G06Q 10/06 | (2012.01) |
| B25J 9/16 | (2006.01) |
| G06F 17/50 | (2006.01) |

(52) U.S. Cl.
CPC ............. *G06F 9/455* (2013.01); *G06Q 10/06* (2013.01); *B25J 9/1671* (2013.01); *G06F 17/50* (2013.01)

(58) Field of Classification Search
CPC ... G06F 17/50; G06F 9/455; G06Q 10/06395; G06Q 10/06; B25J 9/1671
USPC .......................................... 703/22, 13; 706/8
See application file for complete search history.

(56) References Cited

U.S. PATENT DOCUMENTS

| | | | | |
|---|---|---|---|---|
| 2005/0144150 A1* | 6/2005 | Ramamurthy | ......... | G06Q 10/06 706/45 |
| 2005/0147946 A1* | 7/2005 | Ramamurthy | ......... | G06Q 99/00 434/118 |
| 2006/0184410 A1* | 8/2006 | Ramamurthy | ......... | G06Q 10/10 706/8 |

OTHER PUBLICATIONS

Duo, Wang et al., "Intelligent Multi-Agent Based Information System of Business Process Management", 2008, IEEE Pacific-Asia Workshop on Computational Intelligence and Industrial Application, IEEE.*

(Continued)

*Primary Examiner* — Cedric D Johnson
(74) *Attorney, Agent, or Firm* — Prakash Nama; Global IP Services, PLLC

(57) ABSTRACT

An automated system and method for knowledge transfer, end user support and performance tracking during a life cycle of an enterprise application are disclosed. In one embodiment, knowledge information associated with the enterprise application is captured. Further, a simulated enterprise application is created based on the captured knowledge information. In addition, the end users are allowed to use the simulated enterprise application and actual performance of the simulated enterprise application is tracked.

23 Claims, 4 Drawing Sheets

(56) References Cited

OTHER PUBLICATIONS

Wetzstein, Branimir et al., "Monitoring and Analyzing Influential Factors of Business Process Performance" 2009, IEEE International Enterprise Distributed Object Computing Conference, IEEE.*
Kang, Bokyoung et al., "Real-Time Business Process Monitoring Using Formal Concept Analysis", Jun. 2011, Industrial Management and Data Systems, vol. 111, No. 5.*

* cited by examiner

AUTOMATED SYSTEM AND METHOD FOR KNOWLEDGE TRANSFER, END USER SUPPORT AND PERFORMANCE TRACKING DURING A LIFE CYCLE OF ENTERPRISE APPLICATIONS

Benefit is claimed under 35 U.S.C 119(a) to Indian Provisional Patent Application serial number 3268/CHE/2012 entitled "SYSTEM, METHOD AND ARCHITECTURE FOR REDUCING RISK IN IT APPLICATION PROJECTS THROUGHOUT ITS LIFE CYCLE" by Ravi Ramamurthy filed on Aug. 8, 2012.

TECHNICAL FIELD

Embodiments of the present subject matter relate to enterprise applications. More particularly, embodiments of the present subject matter relate to knowledge transfer, end user support and performance tracking during a life cycle of the enterprise applications.

BACKGROUND

Generally, organizations continue to implement new enterprise applications or upgrade existing enterprise applications to be competitive in today's business environment. Typically, in such a changing business environment, the organizations perform knowledge transfer which includes capturing knowledge information and then transferring the captured knowledge information to end users. The organizations may also perform knowledge transfer by sending subject matter experts to various locations of the end users and training the end users. However, during knowledge transfer, the knowledge information may be captured and conveyed manually which can be error-prone. Further, training the end users manually may involve time, cost and resources. Also, due to the manual training, the end users may not retain the knowledge information. Furthermore, the end users may not be provided sufficient support after the enterprise application is deployed, thus resulting in frequent assistance from a central help desk. In this case, capturing and reporting problems faced by the end users to the central help desk are manual which results in high cost to the central help desk and low rates of problem resolution. The end users usage pattern, proficiency in the live enterprise application and visibility of the end users performance on the live enterprise applications are also not known. Therefore, the organizations may face challenges of poor knowledge transfer, insufficient and inefficient training of the end users, low end user adoption, and high attrition rates leading to continuous drop in productivity.

BRIEF DESCRIPTION OF THE DRAWINGS

Various embodiments are described herein with reference to the drawings, wherein.

The drawings described herein are for illustration purposes only and are not intended to limit the scope of the present disclosure in any way.

DETAILED DESCRIPTION

An automated system and method for knowledge transfer, end user support and performance tracking during a life cycle of enterprise applications are disclosed. In the following detailed description of the embodiments of the present subject matter, references are made to the accompanying drawings that form a part hereof, and in which are shown by way of illustration specific embodiments in which the present subject matter may be practiced. These embodiments are described in sufficient detail to enable those skilled in the art to practice the present subject matter, and it is to be understood that other embodiments may be utilized and that changes may be made without departing from the scope of the present subject matter. The following detailed description is, therefore, not to be taken in a limiting sense, and the scope of the present subject matter is defined by the appended claims.

The term "cloud service" refers to a web service hosted on a cloud network to support various operations, such as storing and transforming various documents, collaborative authoring, managing updated documents and so on.

Figure 1:
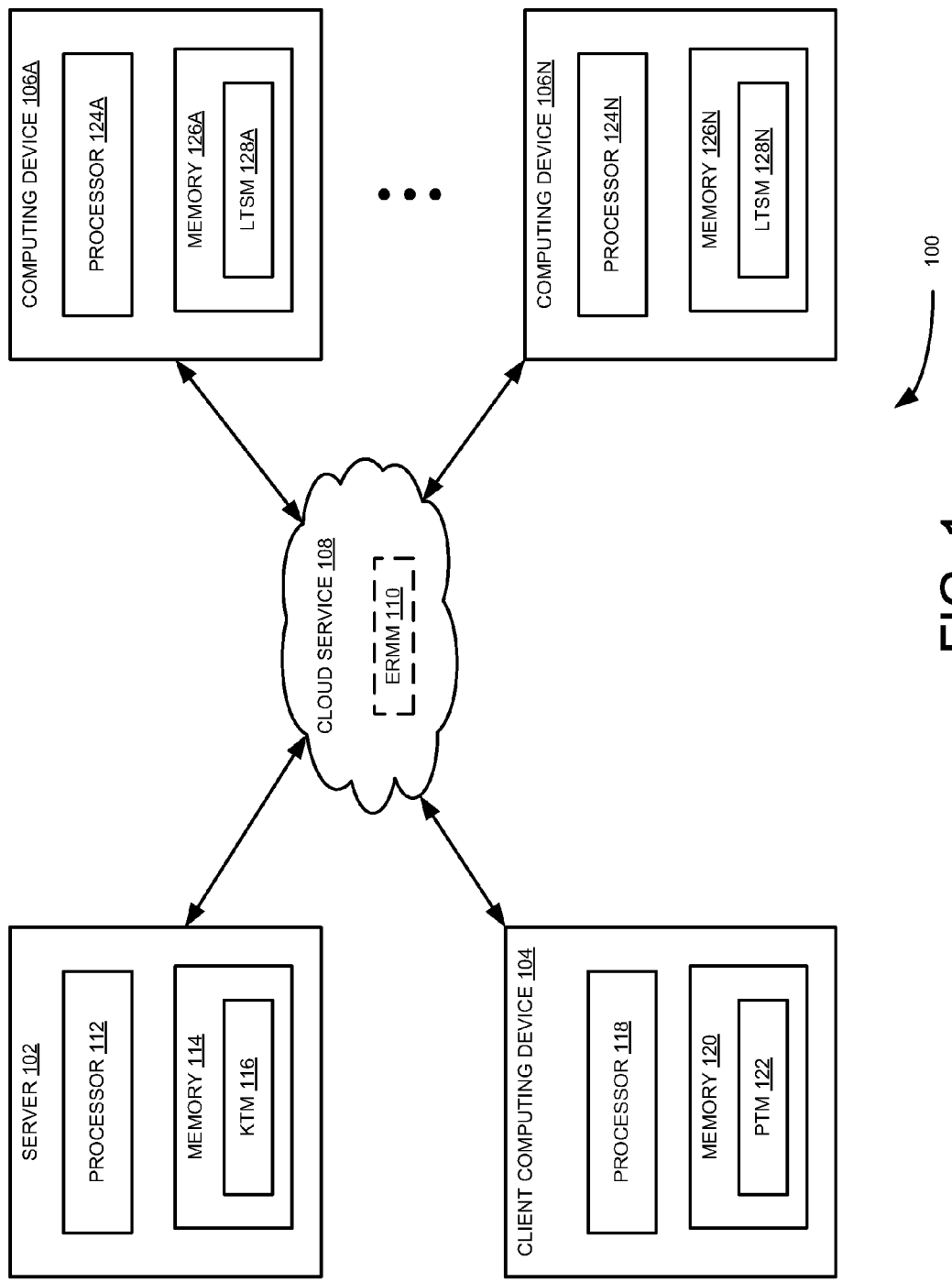
FIG. 1 illustrates an automated system for knowledge transfer, end user support and performance tracking during a life cycle of an enterprise application, according to one embodiment.

FIG. 1 illustrates an automated system 100 for knowledge transfer, end user support and performance tracking during a life cycle of an enterprise application, according to one embodiment. As shown in FIG. 1, the system 100 includes a server 102, a client computing device 104, a plurality of computing devices 106A-N associated with end users and a cloud service 108. Further, the server 102 includes a processor 112 and a memory 114 coupled to the processor 112. Furthermore, the memory 114 includes a knowledge transfer module (KTM) 116. In addition, the client computing device 104 includes a processor 118 and a memory 120 coupled to the processor 118. Moreover, the memory 120 includes a performance tracking module (PTM) 122. Also, the cloud service 108 includes an enterprise resource management module (ERMM) 110. In one example embodiment, the ERMM 110 can reside in the server 102. Further, the computing devices 106A-N include processors 124A-N and memories 126A-N coupled to associated processors 124A-N, respectively. Furthermore, the memories 126A-N include associated live tracking and support modules (LTSMs) 128A-N. In addition as shown in FIG. 1, the server 102, client computing device 104 and the computing devices 106A-N are communicatively coupled to each other via the cloud service 108.

In operation, the KTM 116 captures knowledge information associated with an enterprise application. In one example, the enterprise application includes windows based applications including citrix based applications (i.e., client side applications) and purely image based applications. For example, the knowledge information includes suggestions including actions, screen elements, object properties, screen shots, audio streams, video streams, policies, rules for fields including mandatory or optional information, process workflow, branching information, best practices, time required for the best practices, a number of steps in the best practices, changed steps between two versions of the enterprise application and the like. In one embodiment, the KTM 116 captures the knowledge information when subject matter experts (SMEs) interact with the enterprise application. In this embodiment, the SMEs interact with the enterprise application by performing one or more operations across the enterprise application. The KTM 116 then captures the knowledge information using context strings of the enterprise application. In one example, the KTM 116 uses unique hash codes for every event in the knowledge information to uniquely identify the steps. Any changes in the enterprise application can therefore be easily determined and propagated. In one scenario, the KTM 116 then recreates the knowledge information captured in a particular language of the enterprise application to other languages of the enterprise application. In this scenario, the KTM 116 recreates the knowledge information to the other languages by either rerecording (i.e., playback of the knowledge information on the enterprise application in a different language) or by replacing the knowledge information with the other languages.

Further in operation, the KTM 116 stores the knowledge information in the ERMM 110. Furthermore, the KTM 116 creates a simulated enterprise application based on the knowledge information stored in the ERMM 110. In one embodiment, the KTM 116 creates the simulated enterprise application along with various instructions in the form of manuals, notes, audio streams and the like which helps the end users in using the simulated enterprise application. For example, the audio streams are created by converting the various instructions from text format to audio format. The KTM 116 then stores the simulated enterprise application along with the various instructions in the ERMM 110.

In addition, the KTM 116 allows the end users to use the simulated enterprise application stored in the ERMM 110 via the associated computing devices 106A-N. Moreover, the KTM 116 tracks actual performance of the simulated enterprise application upon use of the simulated enterprise application by the end users. In one embodiment, the KTM 116 allows the end users to provide feedback, via the associated computing devices 106A-N, on the simulated enterprise application using an intelligent document. The KTM 116 then tracks the actual performance of the simulated enterprise application based on the feedback provided by the end users using the intelligent document. In other words, the KTM 116 tracks usage of the knowledge information when the end users learn, practice, take tests or refer to the knowledge information during training or while using the simulation enterprise application. The KTM 116 then tracks the actual performance of the simulated enterprise application based on the usage of the knowledge information by the end users.

In one example embodiment, the KTM 116 then sends the feedback and the simulated enterprise application to the end users in various geographies based on end user definable parameters and/or stores the feedback and the simulated enterprise application in the ERMM 110. The feedback provided by the end users on the simulated enterprise application allows an enterprise application developer to determine problem areas, productivity issues and bottlenecks much before the enterprise application is deployed to the end users. The KTM 116 can also receive documents from the end users and then update the stored information. In some embodiments, the feedback provided by the end users can be used to improve training materials. The feedback provided by the end users for the simulated enterprise application can also be summarized to fine tune the training materials. Also, the KTM 116 ensures that authoring is done in a closed loop. For example, the authoring is done based on the feedback from the end users.

Also in operation, the KTM 116 creates a live enterprise application based on the actual performance of the simulated enterprise application. Further, the KTM 116 allows the end users to use the live enterprise application via the associated computing devices 106A-N. Furthermore in operation, each of the LTSMs 128A-N provides support for continuous improvement and associated end user adoption of the live enterprise application. In one embodiment, the LTSMs 128A-N generate a context map including contexts (e.g., activities, tasks and the like) in the live enterprise application and associated knowledge information. Each of the LTSMs 128A-N then provides support for the continuous improvement and end user adoption based on the generated context map. In one scenario, the LTSMs 128A-N allows the associated end users to share the knowledge information for specific activities, screens or fields in the live enterprise application amongst multiple end users.

In another embodiment, the LTSMs 128A-N provide support for the continuous improvement by automatically capturing information associated with problems faced by the end users in the live enterprise application and automatically transferring the captured information to a central help desk for quick resolution. For example, the information associated with the problems includes the problems, steps that lead to the problems, actual screens, interactions and the like. In this case, the central helpdesk gets an accurate idea of the nature of the problems based on the captured information and provides context specific support to the end users. In one example, the end users can manually capture the information associated with the problems and send the captured information to the central help desk. In yet another embodiment, the LTSMs 128A-N allow the associated end users to provide feedback on the live enterprise application using a live intelligent document. The LTSMs 128A-N provide support for the continuous improvement and end user adoption based on the feedback provided by the associated end users using the live intelligent document.

Also in operation, the PTM 122 tracks actual performance of the live enterprise application upon use of the live enterprise application by the end users. In one example, the PTM 122 tracks actual performance of the simulated enterprise application by considering one or more of the end users. In one embodiment, the PTM 122 creates key performance indicators of the live enterprise application. The PTM 122 then tracks the actual performance of the live enterprise application based on the created key performance indicators. Further, the PTM 122 generates performance reports based on the tracked actual performance of the live enterprise application. This is explained in more detailed with reference to FIG. 2.

Figure 2:
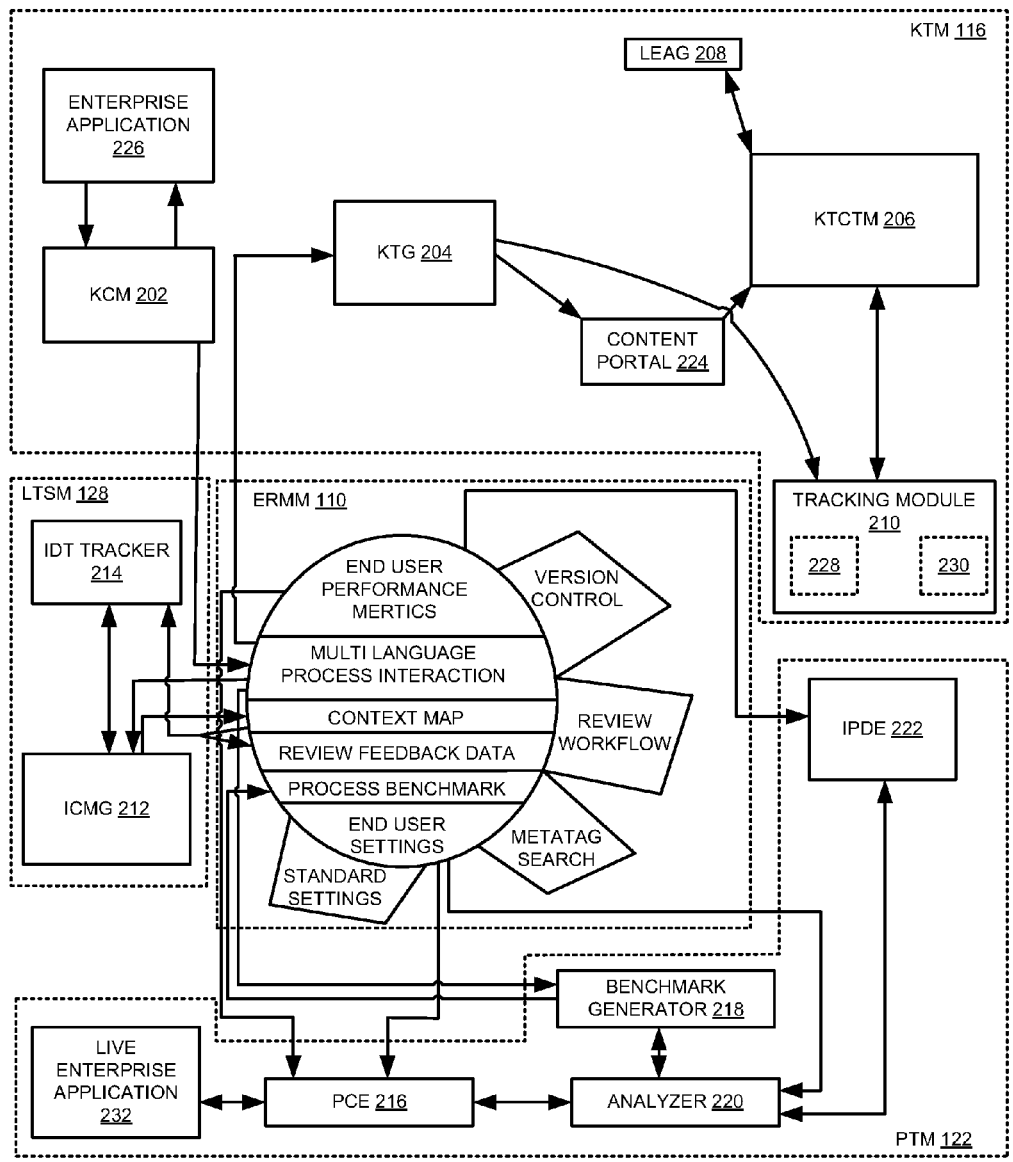
FIG. 2 is a block diagram illustrating components of the system, such as the one shown in FIG. 1, according to one embodiment.

Referring now to FIG. 2, which is a block diagram 200 that illustrates components of the system 100, such as the one shown in FIG. 1, according to one embodiment. Particularly, the block diagram 200 illustrates some of the modules of the KTM 116, a LTSM 128, such as the LTSMs 128A-N of FIG. 1, the PTM 122 and the ERMM 110 of the system 100 of FIG. 1. As shown in FIG. 2, the KTM 116 includes a knowledge information capturing module (KCM) 202, a knowledge information transfer generator (KTG) 204, a knowledge information transfer compliance tracking module (KTCTM) 206, a live enterprise application generator (LEAG) 208, and a tracking module 210 communicatively coupled to each other. Further, the LTSM 128 includes an intelligent dialogue technology context map generator (ICMG) 212 and an intelligent dialogue technology (IDT)

tracker 214 communicatively coupled to each other. Furthermore, the PTM 122 includes a process capture engine (PCE) 216, a benchmark generator 218, an analyzer 220 and an intelligent process discovery engine (IPDE) 222 communicatively coupled to each other.

In operation, the KCM 202 seamlessly captures the knowledge information associated with an enterprise application 226. Further, the KCM 202 adds new knowledge information or changes in the captured knowledge information onto the captured knowledge information. In one embodiment, the KCM 202 automatically translates the captured knowledge information in multiple languages. For example, the KCM 202 can be performed in a service (SaaS) model, a flash drive model, a regular mode and the like. In the SaaS model, based on demand, the KCM 202 can be downloaded based on login and other details, copied to temporary directory and executed. In this case, the knowledge information can be stored in a local drive or can be uploaded to the ERMM 110. In the flash drive model, the KCM 202 can be copied in a flash drive or a compact disk (CD). In this case, the knowledge information can be stored in the flash drive or in a local computing device. In the regular model, the KCM 202 stores the knowledge information in a hard disk. This is explained in more detail with reference to FIG. 3.

Further, the KTG 204 creates the simulated application based on the knowledge information. In other words, the KTG 204 obtains and quickly converts the knowledge information into various kinds of content. For example, the various kinds of content include documents for the enterprise application, documents for newer version of the enterprise application 226, the simulated enterprise application for the enterprise application, the simulated enterprise application (which contains all knowledge aspects (tacit knowledge, change management and so on)) for the newer version of the enterprise application 226 based on the knowledge information and the like. In one embodiment, the KTG 204, using the knowledge information, creates documents with annotation, metadata, step description and tacit knowledge. In one scenario, the KTG 204 customizes look and feel, presentation and language of the simulated enterprise application according to end user preferences. Further, the KTG 204 creates and stores changed document for newer version of the enterprise application 226, multiple language documentation, multiple language simulated enterprise applications and the like in the ERMM 110. In one example, the KTG 204 sends the simulated enterprise application to a content portal 224 and/or the tracking module 210.

Furthermore, the KTG 204 allows an end user to use the simulated enterprise application stored in the ERMM 110 and/or the content portal 224 via an associated computing device, such as the computing devices 106A-N of FIG. 1. In addition, the KTCTM 206 tracks the actual performance of the simulated enterprise application upon use of the simulated enterprise application by the end user via the computing device. In other words, the KTCTM 206 measures efficacy of the knowledge transfer even before the end user starts working on a live enterprise application 232. The KTCTM 206 then tracks the actual performance of the simulated enterprise application while the end user is using the simulated enterprise application from any source, such as compact discs (CDs) or the computing device.

In one embodiment, the KTCTM 206 allows the end user to provide feedback, via the associated computing device, on the simulated enterprise application using an intelligent document 228 (e.g., an image, a hyper-text markup language (HTML) document, portable document format (pdf) file or any other type of document). For example, the end user can provide transmittal and efficient feedback using the intelligent document 228, store the feedback in the intelligent document 228, retrieve the feedback on wide variety of images from the intelligent document 228 and the like. In this example, the images are translated into the intelligent document 228 and the end user is allowed to circle a field on the images and record the feedback. Filters can then be applied and the end user can view the feedback based on various search criteria. In one example, the feedback can be provided for an entire screen, an entire session, screen objects (which are defined by drawing a circle or clicking at a point and then resizing the circle) and the like which includes properties, such as trackable or non trackable. The KTCTM 206 then tracks the actual performance of the simulated enterprise application based on the feedback provided by the end user using the intelligent document 228. The KTCTM 206 also stores the feedback provided by the end user using the intelligent document 228 in the tracking module 210 and/or the ERMM 110.

In another embodiment, the tracking module 210 tracks usage of the knowledge information as the end user learn, practice, take tests or refer to the knowledge information during training or while using the simulation enterprise application. The tracking module 210 then tracks the actual performance of the simulated enterprise application based on the usage of the knowledge information by the end user. In other words, when the end user uses the simulated enterprise application, the tracking module 210 collects required preferences and usage of the simulated enterprise application and then tracks the actual performance of the simulated enterprise application based on the required preferences. In this embodiment, the end user who is using the simulated enterprise application can be tracked either by domain authentication or by an end user profile form.

Also in operation, the LEAG 208 generates a live enterprise application 232 based on the actual performance of the simulated enterprise application. The LEAG 208 then allows the end user to use the live enterprise application 232. In addition, the LTSM 128 provides support for continuous improvement and end user adoption of the live enterprise application 232. In one embodiment, the ICMG 212 generates the context map including contexts in the live enterprise application 232 and associated knowledge information. For example, the context includes activities, tasks and the like in the live enterprise application 232. In this embodiment, the ICMG 212 obtains tacit knowledge, offline content and external content to link the contexts in the live enterprise application 232 and the knowledge information based on parameters, such as content keywords, context ignore words, and application/domain identifiers and the like. In case of the offline content, the ICMG 212 links the contexts and the knowledge information automatically. In case of the external content, the ICMG 212 links the contexts and the knowledge information with intervention of the end user. Furthermore, the ICMG 212 generates the context map between the contexts and the knowledge information based on the links and adds additional information, such as context identifiers, key words when the context have dynamic portions, application identifiers for browser based applications, content search keywords and the like. The ICMG 212 then sends the context map to the IDT tracker 214 and/or the tracking module 210.

Moreover, the IDT tracker 214 sends the associated knowledge information to the end user as context sensitive assistance to use the live enterprise application 232. In one example embodiment, the IDT tracker 214 identifies the context based on interactions of the end user with the live enterprise application 232 and obtains the knowledge information associated with the context from the context map. The IDT tracker 214 then provides support to the end user by sending the knowledge information associated with the context for the continuous improvement and end user adoption. In one example, the IDT tracker 214 automatically provides the knowledge information for the context as a popup when the end user reaches the context. Also, the IDT tracker 214 obtains continuous status notifications about the live enterprise application 232 upon use of the received knowledge information by the end user.

In another embodiment, the LTSM 128 allow the end user to send feedback on the live enterprise application 232 and the received knowledge information including the tacit knowledge using a live intelligent document 230. The LTSM 128 then provides support for the continuous improvement and end user adoption based on the feedback provided by the end user using the live intelligent document 230.

In one example, when the end user is using a word document, the IDT tracker 214 tracks interactions of the end user with the word document. Further, the IDT tracker 214 tracks a context (e.g., save, save as, print and the like) in the word document based on the end user's interactions. Furthermore, the IDT tracker 214 provides support to the end user by obtaining knowledge information associated with the context from the context map.

Further in operation, the PTM 122 tracks actual performance of the live enterprise application 232 upon use of the live enterprise application 232 by the end user. In one embodiment, the PTM 122 creates key performance indicators of the live enterprise application. The PTM 122 then tracks the actual performance of the live enterprise application 232 based on the created key performance indicators. In another embodiment, the PTM 122 tracks actual performance/compliance of the live enterprise application 232 based on the best practices of the end user and/or the SMEs. Furthermore, the PTM 122 generates performance reports based on the actual performance of the live enterprise application 232.

In the above embodiments, the benchmark generator 218 allows the SMEs to define processes in the live enterprise application 232 and sub-divide the processes into unit processes and benchmarks (e.g., a number of steps, duration, a number of warnings and so on) to measure 'completed' and 'aborted' processes. For example, the unit processes includes a combination of steps (defined based on step patterns, such as an application name, a window name, a uniform resource locator (URL) (in case of web based applications), a control name, a control type, a unique control identifier and the like).

Further, the PCE 216 captures the interactions between the end user and the live enterprise application 232 and compares steps performed by the end user while interacting with the live enterprise application 232 to the defined unit processes to automatically identify the unit processes performed by the end user. Furthermore, the analyzer 220 allows a user associated with the client computing device 104 to select the end user to be monitored based on capture preferences, specify the processes that should or should not be captured, set schedules for the time of capture and the like. In addition, the IPDE 222 tracks the actual performance of the live enterprise application 232 based on the benchmarks using regular expressions and hash keys. The IPDE 222 also generates reports providing statistics of the end user following a particular process to help an organization identify the best/worst performing end user and marks processes as complete/incomplete/aborted based on whether the end user reached the completion status. In one example, control charts are provided to identify the process control limits across the organization. The reports can also be customized based on the need of the organization.

Figure 3:
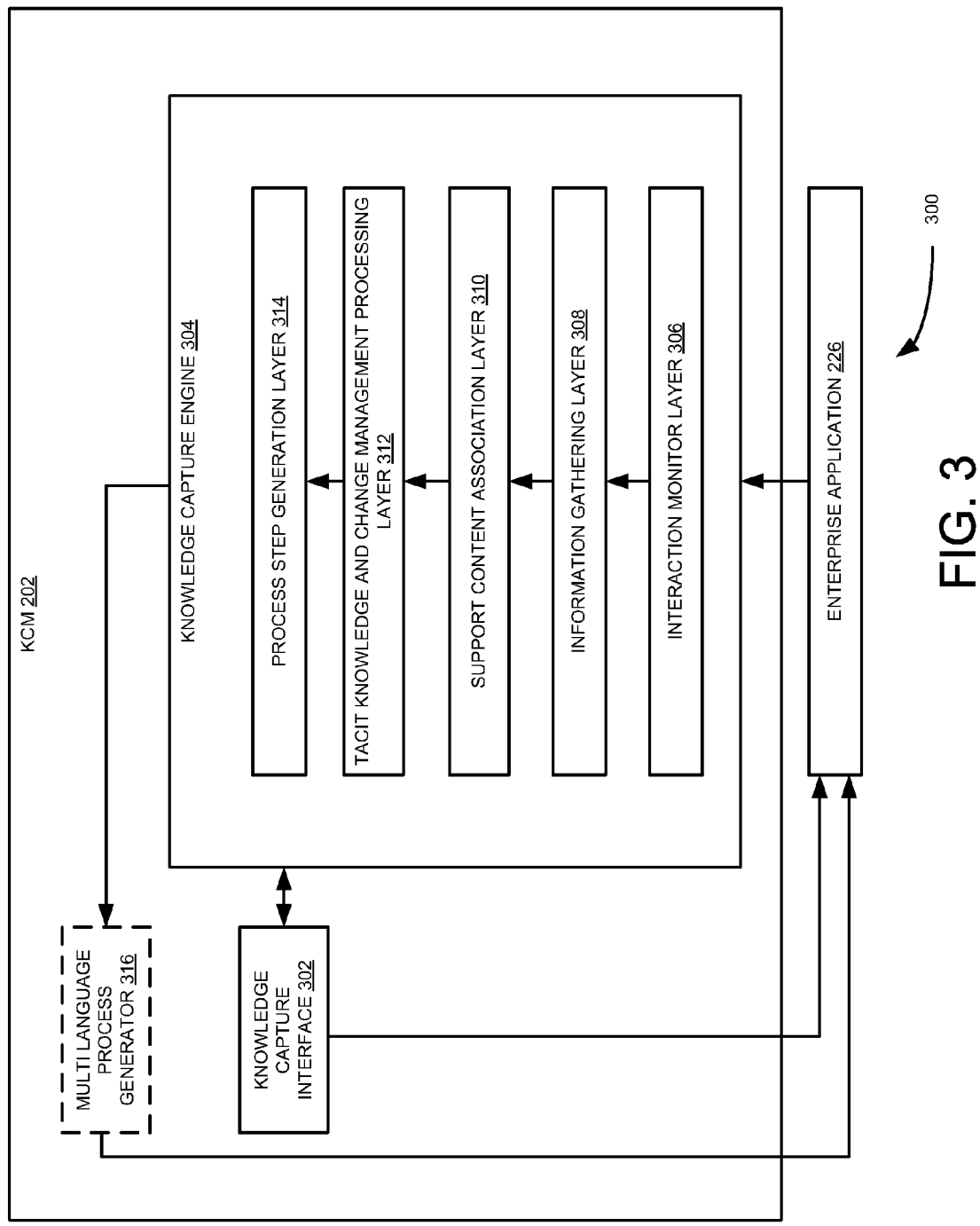
FIG. 3 is a block diagram illustrating a knowledge information capture module (KCM), such as the one shown in FIG. 2, according to one embodiment.

Referring now to FIG. 3, which is a block diagram 300 illustrating the KCM 202, such as the one shown in FIG. 2, according to one embodiment. As shown in FIG. 3, the KCM 202 includes a knowledge capture interface 302, a knowledge capture engine 304, the enterprise application 226 and a multi language process generator 316. Further, the knowledge capture engine 304 includes an interaction monitor layer 306, an information gathering layer 308, a supportive content association layer 310, a tacit knowledge and change management processing layer 312 and a process step generation layer 314. Furthermore, the knowledge capture interface 302, the knowledge capture engine 304, the enterprise application 226 and the multi language process generator 316 are communicatively coupled to each other.

In one embodiment, the knowledge capture interface 302 allows the SMEs to set capture preferences. Further, the knowledge capture engine 304 captures the knowledge information including details of interactions between the SMEs and the enterprise application 226 (e.g., 32 bit or 64 bit application) based on the capture preferences. Furthermore, the knowledge capture engine 304 converts the details into meaningful sentences. In other words, the knowledge capture engine 304 gets maximum information associated with the enterprise application 226 without affecting SME's experience and deletes duplicate and unwanted information. For example, the details of the interactions include an application name, a current dialog caption and associated window co-ordinates, a type of windows message and its properties, and a name and location of a control (e.g., changed process, new process, audio/video, tacit knowledge, manual interactions and the like) with which the SMEs are interacting.

In one example, the interaction monitor layer 306 monitors messages generated in the enterprise application 226 as a result of the interaction by the SMEs to get basic information about a type of action, a region of interaction, the name of the control and the like. Further, the information gathering layer 308 collects the knowledge information using different plug-ins suitable for a type of the enterprise application 226. For example, the type of enterprise application 226 includes SAP®, Oracle®, Peoplesoft, and Siebel® kind of enterprise resource planning (ERP), Catia® and uni-graphics never execute (UG-NX) kind of graphics designing tools, all sorts of applets, apps, portals running in browsers like Internet Explorer® (IE), Firefox® and so on, Rumba®, IBM® PComm, Hummingbird®, Esker® kind of Green screen emulators for legacy mainframe and OS/400® environment, applications running via Citrix® framework, all Java® desktop applications running in IE browser, and all Visual Basic® (VB), Microsoft® Dotnet and win32® based desktop tools in 32 and 64 bit operating system (OS) environment. The information gathering layer 308 also collects the knowledge information associated with applications which have graphical elements, such as a button and the like but are purely images. This is done through algorithms to determine the type of control, the name, the category and the like.

Furthermore, the support content association layer 310 captures the images and audio and/or video streams associated with the enterprise application 226. In addition, the tacit knowledge and change management processing layer 312 tags the enterprise application 226 with the tacit knowledge information provided by the SMEs and changes in the enterprise application 226. In one example, tacit knowledge and change management processing layer 312 automatically knows the changes as each step is uniquely encoded. The tacit knowledge and change management processing layer 312 also facilitates editing of the knowledge information (sentences, control level raw information, region redrawing, image replacement, image masking, security and alias name definition for controls and so on). Also, the process step generation layer 314 generates the meaningful sentences along with the suitable images and other associative contents like external audio and/or video streams, screen flow video and so on. Moreover, the multi language process generator 316, an optional layer, re-generates the meaningful sentences into different languages with all associated content.

Figure 4:
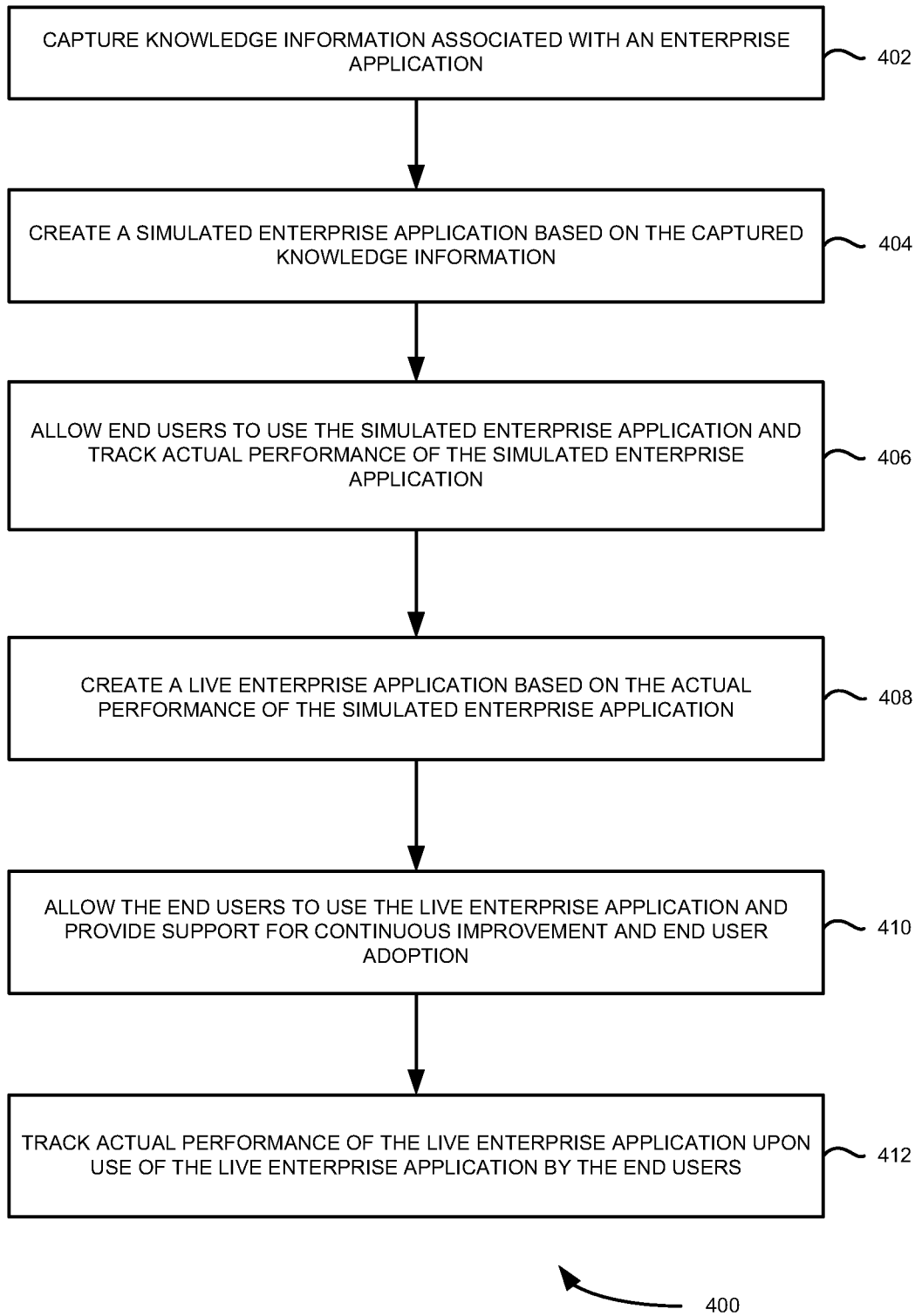
FIG. 4 illustrates a flow chart of an automated method for knowledge transfer, end user support and performance tracking during the life cycle of the enterprise application, according to one embodiment.

Referring now to FIG. 4, which illustrates a flowchart 400 of an automated method for knowledge transfer, end user support and performance tracking during a life cycle of an enterprise application, according to one embodiment. At step 402, knowledge information associated with the enterprise application is captured. At step 404, a simulated enterprise application is created based on the captured knowledge information. At step 406, end users are allowed to use the simulated enterprise application and actual performance of the simulated enterprise application is tracked. At step 408, a live enterprise application is created based on the actual performance of the simulated enterprise application. At step 410, the end users are allowed to use the live enterprise application and support for continuous improvement and end user adoption is provided to the end users. At step 412, actual performance of the live enterprise application is tracked upon use of the live enterprise application by the end users. This is explained in more detail with reference to FIGS. 1-3.

In various embodiments, the systems and methods described in FIGS. 1-4 propose a technique to transfer the knowledge information during the life cycle of the enterprise application to the end users. The proposed technique provides a combination of automatic capture of the knowledge information, automatic transfer of the knowledge information, automatic analysis of the enterprise application using the simulated enterprise application and context based support for the end users to enable the organizations to implement the enterprise application and/or updated enterprise application with minimized risk, better end user adoption, higher return on investments (ROIs) with continuous improvement of the enterprise application. Further, the technique enables the end users to work on the simulated enterprise applications associated with the live enterprise application, thus reduces the cost of updating the live enterprise application. Furthermore, the technique automatically enables the end users to peruse only through the modifications by updating only modifications in the live enterprise application.

In one embodiment, an article comprising a non-transitory computer readable storage medium having instructions thereon which when executed by a computing platform result in execution of the above mentioned method. The method described in the foregoing may be in a form of a machine-readable medium embodying a set of instructions that, when executed by a machine, causes the machine to perform any method disclosed herein. It will be appreciated that the various embodiments discussed herein may not be the same embodiment, and may be grouped into various other embodiments not explicitly disclosed herein.

Although certain methods, apparatus, and articles of manufacture have been described herein, the scope of coverage of this patent is not limited thereto. To the contrary, this patent covers all methods, apparatus, and articles of manufacture fairly falling within the scope of the appended claims either literally or under the doctrine of equivalents.

What is claimed is:

1. An automated method, comprising:
capturing knowledge information associated with an enterprise application;
creating, using a computer, a simulated enterprise application based on the captured knowledge information;
allowing end users to use the simulated enterprise application and tracking actual performance of the simulated enterprise application, wherein tracking the actual performance of the simulated enterprise application comprises:
   allowing the end users to provide feedback on the simulated enterprise application using an intelligent document, wherein the feedback and the simulated enterprise application is associated with end user definable parameters, and where the intelligent document allows the end users to provide transmittal and efficient feedback, including interacting with image data and modifying screen objects and properties associated with the intelligent document, and apply filters to view feedback based on various search criteria, in order to provide the feedback; and
   tracking the actual performance of the simulated enterprise application based on the feedback provided by the end users using the intelligent document;
creating, by the end users using the computer, a live enterprise application based on the actual performance of the simulated enterprise application;
allowing the end users to use the live enterprise application; and
providing support for end user adoption and continuously improving the live enterprise application based on the created live enterprise application.

2. The automated method of claim 1, wherein providing support for the continuous improvement and end user adoption, comprises:
generating a context map including contexts in the live enterprise application and associated captured knowledge information; and
providing support for the continuous improvement and end user adoption based on the generated context map.

3. The automated method of claim 1, wherein providing support for the continuous improvement and end user adoption, comprises:
allowing the end users to provide feedback on the live enterprise application using a live intelligent document; and
providing support for the continuous improvement and end user adoption based on the feedback provided by the end users using the live intelligent document.

4. The automated method of claim 1, wherein providing support for the continuous improvement and end user adoption, comprises:
capturing information associated with problems faced by the end users in the live enterprise application; and
transferring the captured information to a central help desk for quick resolution.

5. The automated method of claim 1, further comprising:
tracking actual performance of the live enterprise application upon use of the live enterprise application by the end users.

6. The automated method of claim 5, further comprising:
generating performance reports based on the actual performance of the live enterprise application.

7. The automated method of claim 5, wherein tracking the actual performance of the live enterprise application, comprises:
creating key performance indicators of the live enterprise application; and
tracking the actual performance of the live enterprise application based on the created key performance indicators.

8. The automated method of claim 1, wherein the knowledge information comprises suggestions including actions, screen elements, object properties, screen shots, audio streams, video streams, policies, rules for fields including mandatory or optional information, process workflow, and/or branching information.

9. An automated system, comprising:
a cloud service, comprising:
an enterprise resource management module (ERMM); and a server communicatively coupled to the cloud service, comprising:
a knowledge transfer module (KTM), wherein the KTM is configured to:
capture knowledge information associated with an enterprise application;
create, using a computer, a simulated enterprise application based on the captured knowledge information and store the simulated enterprise application and the captured knowledge information in the ERMM; and
allow end users to use the simulated enterprise application and track actual performance of the simulated enterprise application, wherein tracking the actual performance of the simulated enterprise application comprises:
allow the end users to provide feedback on the simulated enterprise application using an intelligent document, wherein the feedback and the simulated enterprise application is associated with end user definable parameters, and wherein the intelligent document allows the end user to provide transmittal and efficient feedback, including interacting with image data and modifying screen objects and properties associated with the intelligent document, and apply filters to view feedback based on various search criteria, in order to provide the feedback;
track the actual performance of the simulated enterprise application based on the feedback provided by the end users using the intelligent document;
create, by the end users using the computer, a live enterprise application based on the actual performance of the simulated enterprise application;
allow the end users to use the live enterprise application; and
provide support for end user adoption and continuously improve the live enterprise application.

10. The automated system of claim 9, further comprising:
a plurality of computing devices associated with the end users, wherein the plurality of computing devices is communicatively coupled to the cloud service and wherein each of the plurality of computing devices includes a live tracking and support module (LTSM) to provide support for continuous improvement and end user adoption of the live enterprise application.

11. The automated system of claim 10, wherein the LTSM is configured to:
generate a context map including contexts in the live enterprise application and associated captured knowledge information; and
provide support for the continuous improvement and end user adoption based on the generated context map.

12. The automated system of claim 10, wherein the LTSM is configured to:
allow the end users to provide feedback on the live enterprise application using a live intelligent document; and
provide support for the continuous improvement and end user adoption based on the feedback provided by the end users using the live intelligent document.

13. The automated system of claim 9, further comprising:
a client computing device communicatively coupled to the cloud service, wherein the client computing device comprises a performance tracking module (PTM) to track actual performance of the live enterprise application upon use of the live enterprise application by the end users.

14. The automated system of claim 13, wherein the PTM is further configured to:
generate performance reports based on the actual performance of the live enterprise application.

15. The automated system of claim 13, wherein the PTM is configured to:
create key performance indicators of the live enterprise application; and
track the actual performance of the live enterprise application based on the created key performance indicators.

16. The automated system of claim 9, wherein the knowledge information comprises suggestions including actions, screen elements, object properties, screen shots, audio streams, video streams, policies, rules for fields including mandatory or optional information, process workflow, and/or branching information.

17. A non-transitory computer-readable storage medium having instructions that when executed by a computing device, cause the computing device to:
capture knowledge information associated with an enterprise application;
create, using a computer, a simulated enterprise application based on the captured knowledge information; and
allow end users to use the simulated enterprise application and tracking actual performance of the simulated enterprise application, wherein tracking the actual performance of the simulated enterprise application comprises:
allowing the end users to provide feedback on the simulated enterprise application using an intelligent document, wherein the feedback and simulated enterprise application is associated with end user definable parameters, and wherein intelligent document allows the end users to provide transmittal and efficient feedback, including interacting with image data and modifying screen objects and properties associated with the intelligent document, and apply filters to view feedback based on various search criteria, in order to provide the feedback;
tracking the actual performance of the simulated enterprise application based on the feedback provided by the end users using the intelligent document;

creating, by the end users using the computer, a live enterprise application based on the tracking of the actual performance of the simulated enterprise application;

allowing the end users to use the live enterprise application; and providing support for end user adoption and continuously improving the live enterprise application based on the created live enterprise application.

18. The non-transitory computer-readable storage medium of claim 17, wherein providing support for the continuous improvement and end user adoption, comprises:

generating a context map including contexts in the live enterprise application and associated captured knowledge information; and providing support for the continuous improvement and end user adoption based on the generated context map.

19. The non-transitory computer-readable storage medium of claim 17, wherein providing support for the continuous improvement and end user adoption, comprises:

allowing the end users to provide feedback on the live enterprise application using a live intelligent document; and providing support for the continuous improvement and end user adoption based on the feedback provided by the end users using the live intelligent document.

20. The non-transitory computer-readable storage medium of claim 17, further comprising:

tracking actual performance of the live enterprise application upon use of the live enterprise application by the end users.

21. The non-transitory computer-readable storage medium of claim 20, further comprising:

generating performance reports based on the actual performance of the live enterprise application.

22. The non-transitory computer-readable storage medium of claim 20, wherein tracking the actual performance of the live enterprise application, comprises:

creating key performance indicators of the live enterprise application; and tracking the actual performance of the live enterprise application based on the created key performance indicators.

23. The non-transitory computer-readable storage medium of claim 17, wherein the knowledge information comprises suggestions including actions, screen elements, object properties, screen shots, audio streams, video streams, policies, rules for fields including mandatory or optional information, process workflow, and/or branching information.

* * * * *